United States Patent

Chang et al.

[11] Patent Number: 6,146,924
[45] Date of Patent: Nov. 14, 2000

[54] MAGNETIC INSERT INTO MOLD CAVITY TO PREVENT RESIN BLEEDING FROM BOND AREA OF PRE-MOLD (OPEN CAVITY) PLASTIC CHIP CARRIER DURING MOLDING PROCESS

[75] Inventors: Daniel Chang, Taipei; Chengder Huang, Kaohsiung; Pei-Haw Tsao, Taichung, all of Taiwan

[73] Assignee: Vanguard International Semiconductor Corporation, Hsin-Chu, Taiwan

[21] Appl. No.: 09/368,858

[22] Filed: Aug. 6, 1999

[51] Int. Cl.[7] .......................... H01L 21/44; H01L 21/302
[52] U.S. Cl. .......................... 438/126; 438/745; 438/747; 438/748; 438/749
[58] Field of Search ..................................... 438/126, 745, 438/747, 748, 749

[56] References Cited

U.S. PATENT DOCUMENTS

| | | | |
|---|---|---|---|
| 4,705,205 | 11/1987 | Allen et al. | 228/180 |
| 4,966,556 | 10/1990 | Reymond et al. | 439/80 |
| 5,263,583 | 11/1993 | Ohashi | 206/334 |
| 5,366,380 | 11/1994 | Reymond | 439/66 |
| 5,469,334 | 11/1995 | Balakrishnan | 361/782 |
| 5,766,496 | 6/1998 | Martin | 438/745 |
| 5,768,108 | 6/1998 | Miura et al. | 361/792 |
| 5,841,190 | 11/1998 | Noda et al. | 257/678 |

*Primary Examiner*—Richard Elms
*Assistant Examiner*—Michael S. Lebentritt
*Attorney, Agent, or Firm*—George O. Saile; Stephen B. Ackerman

[57] ABSTRACT

A new method is provided for the creation of a pre-molded chip carrier. The invention teaches putting magnetic inserts into the upper mold. The magnetic inserts attract the lead fingers that are inserted into the upper mold during the process of filling the cavity with a compound pressing the lead fingers tightly against the surface of the magnet. The possibility of mold compound spilling over the lead fingers and forming resin depositions on the surface of the lead fingers is thereby voided.

10 Claims, 2 Drawing Sheets

MAGNETIC INSERT INTO MOLD CAVITY TO PREVENT RESIN BLEEDING FROM BOND AREA OF PRE-MOLD (OPEN CAVITY) PLASTIC CHIP CARRIER DURING MOLDING PROCESS

BACKGROUND OF THE INVENTION (1) Field of the Invention

The invention relates to the fabrication of integrated circuit devices, and more particularly, to a method of encapsulating chips.

(2) Description of the Prior Art

In packaging semiconductor chips frequent use is made of methods to encapsulate the chips in packages that are aimed at further usage of the encapsulated chips. These packages have to meet typical requirements of high speed processing environments and are therefore heavily influenced by considerations of cost, usability, quality, ease and repeatability of manufacturing, throughput speed and others.

One of the more commonly materials that is used for this purpose is resin. Resins occur freely in a natural environment where industrially applied resins are synthetically prepared and can be created with many properties that apply for a given application. Synthetic resins (such as alkyd resins or phenolic resins) usually have high molecular weight and may have some of the properties of natural resins. Synthetic resins however are typically very different from natural resins. Synthetic resins may be thermoplastic or thermosetting, they can be made by polymerization or condensation, and they are used mostly as plastics or the essential ingredients of plastic, in varnishes or other coatings, in adhesives and in ion exchange.

In the semiconductor industry, resins are frequently molded into particular forms or shapes that are used to house or package semiconductor chips. These completed molds then serve as chip carrier and may contain parts within the mold that facilitate or enable this function such as a die pad (to position the chip onto), metal extensions (lead fingers) that serve to interconnect the packaged chip with its surrounding electrical environment and means (wire bonding) for connecting the chip to the metal extensions.

It is thereby also common practice to adapt plastic or resin chip carriers to a high speed semiconductor manufacturing environment, for the main reason that this is the predominant environment that is being used to produce high volumes of semiconductor chips at a competitive price. The chip carriers must thereby also be adaptable to a variety of chip sizes, again to make the chip carrier acceptable from a cost point of view. To adapt the chip carrier to a high-speed manufacturing environment, the design must be such that no parts of the carrier can interfere with the manufacturing process due to protruding parts of the carrier. This could cause deformation of the protruding part in addition to slowing down the manufacturing process due to the required intervention to remove the offending carrier.

One of the most important considerations in the use of plastic chip carriers is the consideration of producing the carriers such that they meet design considerations of surface smoothness while surface of sub-components that are part of the carriers must remain free of spurious depositions that may limit or inhibit their proper functioning. The mold cavity frequently consists of two sections, an upper section and a lower section. The lower section forms, after molding, the vehicle for mounting the chip and for supporting lead fingers. These supporting components are inserted in the lower mold prior to the formation of the pre-molded plastic chip carrier. In Prior Art processes for making plastic chip carriers, resin bleeding, also referred to as flash, tends to occur over the surface of lead fingers of pre-molded, open cavity plastic chip carriers. Whereas the surface of lead fingers, which are used for interconnecting the chip with the surrounding terminal, is liable to be covered with resin flash during the filling of the encapsulant, the makers or suppliers of pre-molded plastic chip carriers usually require that the resin bleeding is removed through chemical, electro, and/or mechanical de-flash processes and thereby expose the bond area in order to make a smooth and reliable interconnect. Where a thicker layer of flash occurs on the lead wires, these approaches often do not lead to success and parts must be scrapped. This in turn leads to significant yield loss and to a significant decrease in product throughput. The invention addresses these problems caused by resin bleeding.

SUMMARY OF THE INVENTION

A principle objective of the invention is to prevent the formation of resin flash or resin bleeding on the lead fingers of a chip carrier during encapsulant filling.

Another objective of the invention is to prevent resin bleeding from the bond area of pre-mold or open cavity of a plastic chip carrier during the process of molding of this carrier.

In accordance with the objectives of the invention a new method is provided for the creation of pre-molded chip carriers. The invention teaches putting magnetic inserts into the upper mold during the manufacturing of the upper mold. The magnetic inserts attract the lead fingers during the process of filling the mold cavity with a compound pressing the lead fingers tightly against the surface of the magnet. The possibility of mold compound spilling over the lead fingers and forming resin depositions on the surface of the lead fingers is thereby voided.

DESCRIPTION OF THE PREFERRED EMBODIMENTS

Figure 1:
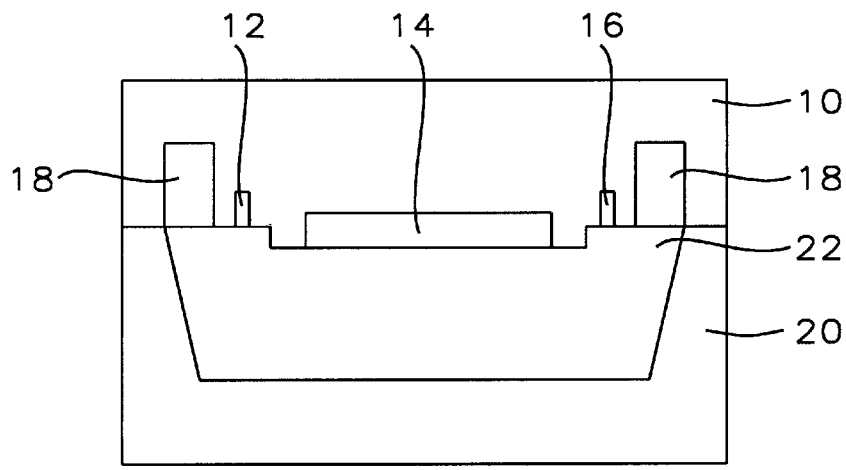
FIG. 1 shows a cross section of a mold cavity with modifications in the upper mold cavity.
Figure 2:
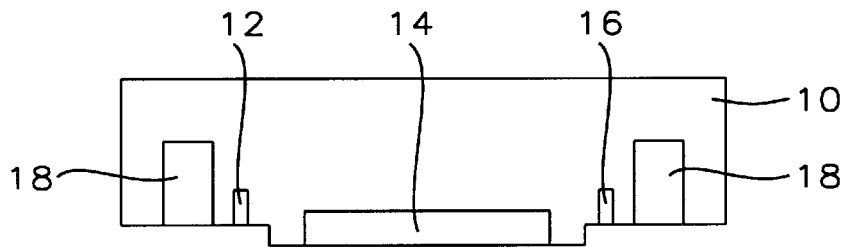
FIG. 2 shows a cross section of a detailed side view of an upper portion of a mold cavity with modifications to the upper mold cavity.
Figure 3:
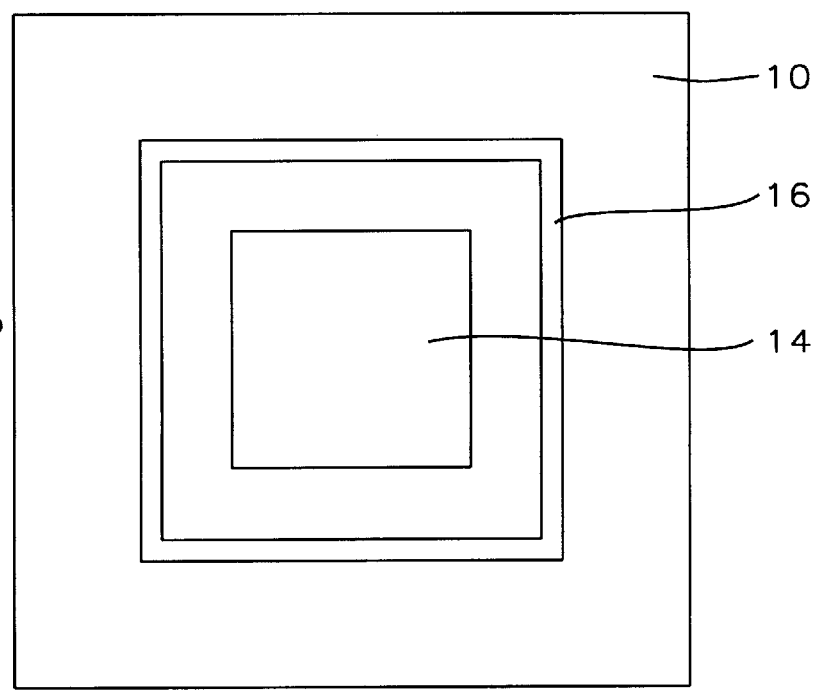
FIG. 3 shows a bottom view of the upper mold cavity.

FIGS. 1 through 3 present a cross section of the mold cavity that is used to create the pre-molded chip carrier. The term pre-molded refers here to the procedure where the chip carrier is first produced as an independent step of production, in the chip carrier a die pad is provided onto which the chip is placed during the operation of attaching the chip to the (pre-molded) chip carrier. The die is typically attached to the die pad using a silver paste or a conductive paste. Final wire bonding attaches the die to the lead fingers of the pre-molded chip carrier.

FIG. 1 shows a cross section of the upper mold cavity 10 and the lower mold cavity 20. Opening 12, 14 and 16 are provided for the insertion of magnets. Cavities 18 are provided for easy of handling of the completed chip carrier while cavity 22 forms the main body of the chip carrier.

FIG. 2 shows the cross section of the upper mold cavity with the same design details as previously indicated for FIG. 1.

FIG. 3 shows a bottom view of the upper mold cavity 10, which clearly highlights the design of the cavity 16 for the magnetic insert and cavity 14 also for the magnetic insert. The functions of the magnets that are to be inserted into cavities 14 and 16 are as follows: the die pad (the pad onto which the die is positioned when it is being mounted onto the chip mold) that is inserted underneath the magnet that is inserted into cavity 14 is clamped firmly against the magnet during the process of forming the molded chip carrier thus avoiding the accumulation of mold on the surface of the die pad. The magnet that is inserted into cavity 16 serves a similar function but this function now relates to the lead fingers that extend outwards from the molded chip carrier. The magnet that is inserted into cavity 16 firmly attracts the lead fingers during the process of injecting the mold into the mold cavity. This clamping of the lead fingers to the overlying magnets in cavity 16 inhibit the flow of mold over the top surface of the lead finger and, in so doing, inhibits the formation of mold compound on the surface of the lead fingers. The phenomenon of mold being deposited on the surface of the lead fingers has, in the past, resulted in required cleaning actions and device damage.

Figure 4:
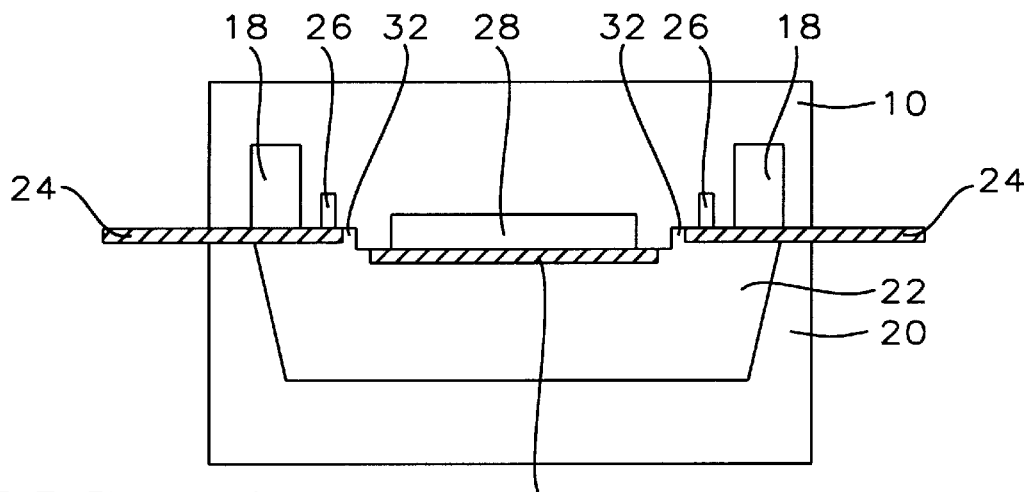
FIG. 4 shows a cross section of a filled mold cavity of the invention with magnetic inserts.

FIG. 4 shows a cross section of the mold cavity of the invention with the magnets inserted in place. The cross section that is shown in FIG. 4 represents the stage in the creation of the plastic chip carrier where two magnets 26 and 28 have been inserted into the upper mold cavity, the lead fingers 24 have been inserted between the upper and the lower mold cavities and the die pad 30 has also been inserted between the upper and the lower mold cavity. Magnet 28 tightly attracts the die pad 30 thereby preventing any of the plastic (that is used to fill the mold cavity) to be deposited on the top surface of the die pad 30. Magnets 26 tightly attract the lead fingers 24 thereby preventing the mold compound from being deposited on the surface of the lead fingers 24. The main purpose of extrusions 32 is to strongly wedge the lead fingers 24 such that the lead fingers 24 can be firmly attached and assure good interconnect between the chip bond pad 30 and the lead fingers 24. Also to be noted is that these extrusions 32 block any plastic from flowing onto the surface of the lead fingers 24 since these lead fingers are further tightly wedged against the magnets 26. The molding compound fills up cavities 22 and 18 in addition to forming extrusions 32. It must again be pointed out that the lead fingers 24 and the die pad 30 contain Ni-Fe or a Ni alloy or any other suitable metal that has magnetic properties that allow the lead fingers 24 and the die pad 30 to be tightly pressed against the inserted magnet 26 and 28. This prevents any of the molding compound to be deposited on the top surfaces of the lead fingers 24 or the die pad 30.

Figure 5:
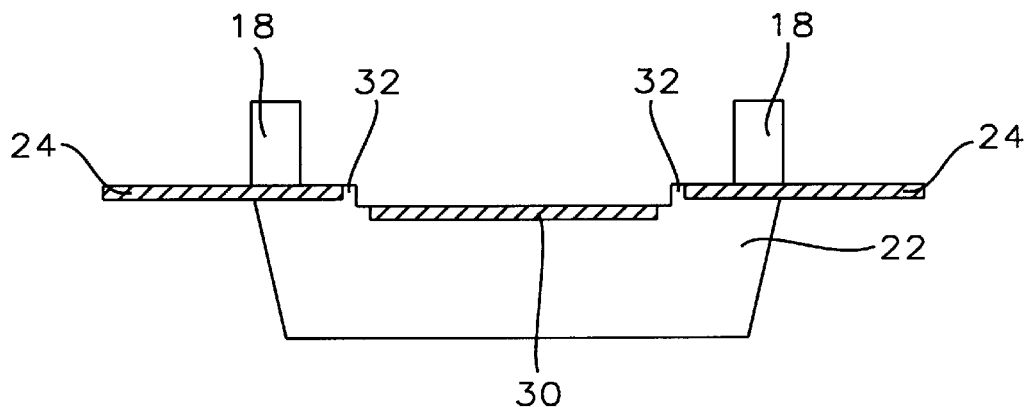
FIG. 5 shows a cross section of the pre-molded chip carrier of the invention.

FIG. 5 shows a cross section of the completed plastic chip carrier after the cavities 18 and 22 (including extrusion 26) have been filled and the upper and lower mold cavities 10 and 20 have been removed. The die pad 30 is now on place on the surface of the molded carrier 18/22 while the lead fingers 24 protrude from the molded chip carrier.

Figure 6:
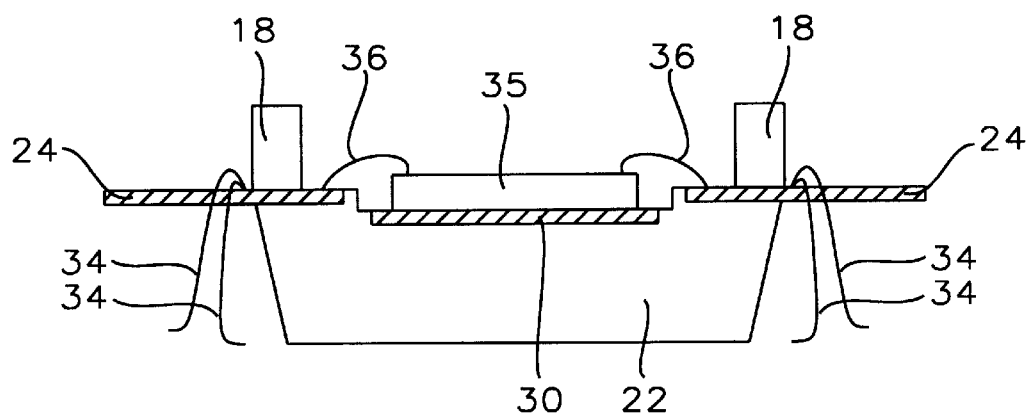
FIG. 6 shows a cross section of the pre-molded chip carrier of the invention with the chip mounted and bond wires attached.

FIG. 6 shows the final stage of chip assembly onto the pre-molded chip carrier. The chip 35 is placed on top of the chip pad 30, the chip is connected to the lead fingers 24 by means of bond wires 36, the lead fingers 24 are connected to the surrounding circuitry by means of electrical interconnect lines 34.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a pre-molded plastic chip carrier, comprising the steps of:

forming a lower mold said lower mold containing a lower mold cavity;

forming an upper mold said upper mold containing an upper mold cavity;

inserting magnets into said upper mold; attaching a die pad and conducting lead fingers to said upper mold;

mating said lower mold with said upper mold thereby creating a complete mold assemblage with a complete mold cavity; injecting a molding compound into said complete mold cavity; curing said injected molding compound; and removing said lower and upper mold thereby freeing said pre-molded plastic chip carrier.

2. The method of claim 1 wherein said lower mold when matched and mated with said upper mold meets all design requirements imposed by environmental and electrical requirements that are in force for adequate, reliable and cost effective mounting of semiconductor chips on the surface of said pre-molded plastic chip carrier wherein furthermore the cavities for the creation of said pre-molded plastic chip carrier are created in the top surface of said lower mold.

3. The method of claim 1 wherein said forming an upper mold comprises:

designing said upper mold such that when matched and mated with said lower mold said upper mold meets all design requirements imposed by environmental and electrical requirements that are in force for adequate, reliable and cost effective mounting of semiconductor chips on the surface of said pre-molded plastic chip carrier;

providing cavities for the creation of said pre-molded plastic chip carrier said cavities to be created in the lower surface of said upper mold; and providing additional cavities said cavities to be in the lower surface of said upper mold said lower surface being the surface of said upper mold that matches and mates with the upper surface of said lower mold.

4. The method of claim 3 wherein said additional cavities are of a profile such that bodies of metal or any other configuration of components that have magnetic properties of attracting or rejecting other metal can be inserted into said additional cavities whereby furthermore the locations of said additional cavities match and mate with the locations where the die pad and lead fingers of lines that connect said die to surrounding points of electrical contact must be positioned within said pre-molded plastic chip carrier.

5. The method of claim 4 whereby said magnetic properties of attracting or rejecting other metal can be controlled in a manner that is independent of and external to said lower and upper mold such that said attracting or rejecting other metal can be activated or can be negated.

6. The method of claim 1 wherein said inserting magnets into said upper mold is inserting magnets of metal or any other configuration of components that have magnetic properties of attracting or rejecting other metal into said additional cavities in said upper mold thereby inserting die pad magnets for said die pad and lead finger magnets for said lead fingers.

7. The method of claim 1 wherein said attaching a die pad is attaching the die pad such that the geometric center of the die pad essentially coincides with the geometric center of said upper mold whereby the plane of said die pad is parallel to the lower plane of said upper mold whereby furthermore the location of said die pad matches and mates with the die pad magnet that has been inserted into the upper mold.

8. The method of claim 1 wherein said attaching conducting lead fingers to said upper mold is attaching a plurality of conducting lines around the periphery of said upper mold whereby said lead fingers match and mate with the lead finger magnets that have been inserted into said upper mold.

9. The method of claim 1 wherein said mating said lower mold with said upper mold is aligning the geometric center of said die pad mounted in the lower surface of the upper mold with the geometric center of the upper surface of the lower mold furthermore bringing the lower surface of the upper mold in direct and intimate contact with the upper surface of the lower mold.

10. The method of claim 1 with the additional step of providing wire bond connections between the die that is mounted on the surface of the pre-molded chip carrier and the lead fingers that have been provided for this purpose on the surface of the pre-molded chip carrier.

* * * * *